US012572121B2

(12) United States Patent
Allgaier et al.

(10) Patent No.: US 12,572,121 B2
(45) Date of Patent: Mar. 10, 2026

(54) FIELD DEVICE AND MODULAR FIELD DEVICE SYSTEM

(71) Applicant: VEGA GRIESHABER KG, Wolfach (DE)

(72) Inventors: Volker Allgaier, Haslach (DE); Ralf Schätzle, Fischerbach (DE); Stefan Kasper, Hofstetten (DE)

(73) Assignee: VEGA Grieshaber KG, Wolfach (DE)

( * ) Notice: Subject to any disclaimer, the term of this patent is extended or adjusted under 35 U.S.C. 154(b) by 547 days.

(21) Appl. No.: 18/100,055

(22) Filed: Jan. 23, 2023

(65) Prior Publication Data

US 2023/0259089 A1　　Aug. 17, 2023

(30) Foreign Application Priority Data

Jan. 27, 2022　　(EP) ..................................... 22153786

(51) Int. Cl.
*G05B 19/042*　　(2006.01)
*H05K 5/00*　　(2025.01)
*H05K 5/02*　　(2006.01)

(52) U.S. Cl.
CPC ......... *G05B 19/042* (2013.01); *H05K 5/0018* (2022.08); *H05K 5/0208* (2013.01); *G05B 2219/25187* (2013.01); *G05B 2219/25334* (2013.01); *G05B 2219/25428* (2013.01); *G05B 2219/37326* (2013.01); *G05B 2219/37357* (2013.01)

(58) Field of Classification Search
CPC .. H05K 5/0208; H05K 5/0018; G05B 19/042; G05B 2219/25428; G05B 2219/25334; G05B 2219/25187; G05B 2219/37326; G05B 2219/37357
See application file for complete search history.

(56) References Cited

U.S. PATENT DOCUMENTS

2012/0161978　A1*　6/2012　Sakurai .................. H04L 67/125
340/870.02

FOREIGN PATENT DOCUMENTS

| | | |
|---|---|---|
| DE | 102010063226 A1 | 6/2012 |
| DE | 102017216677 A1 | 3/2019 |
| WO | WO-2017059973 A1 * | 4/2017 ........... G05B 19/042 |

OTHER PUBLICATIONS

Field Device Comprising a Radio Module That can be Activated by an Actuating Element (Year: 2017).*
EPO Extended European Search Report for application EP 22153786 issued on Jul. 22, 2022.

* cited by examiner

*Primary Examiner* — An H Do
(74) *Attorney, Agent, or Firm* — William Gray Mitchell

(57) ABSTRACT

An automation technology field device, including a radio module, wherein the radio module is configured such that it forms at least one first radio channel and one second radio channel, wherein the first radio channel is configured for a reading access and the second radio channel for a writing access to the field device, characterized in that the second radio channel is deactivated in a basic state of the field device and the field device has a switching element at least partially realized as hardware, wherein the switching element is configured such that the second radio channel can be activated.

12 Claims, 2 Drawing Sheets

<u>Fig. 1</u>

FIELD DEVICE AND MODULAR FIELD DEVICE SYSTEM

CROSS REFERENCE TO RELATED APPLICATIONS

This patent application claims priority to European Patent Application 22153786.3, filed on Jan. 27, 2022.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

Field of the Invention

The invention is a field device and modular field device system.

Background of the Invention

Field devices that serve for determining and/or influencing process variables are often used in process automation engineering. Filling level measuring devices, limit level measuring devices and pressure measuring devices with sensors acquiring the respective process variables filling level, limit level or pressure are examples of such field devices. Such field devices are frequently connected to higher-level units, e.g. to guidance systems or control units. These higher-level units serve for controlling, visualizing and/or monitoring processes. The field devices known from the prior art generally have a housing, a sensor and an electronics module disposed in the housing.

The energy and/or signal transmission between the field device and higher-level units is frequently carried out in accordance with the known 4 mA to 20 mA standard, in which a 4 mA to 20 mA current loop or a two-wire line is formed between the field device and the higher-level unit. In addition to the analog transmission of signals, there is the option of the measuring devices transmitting further information to the higher-level unit, or receiving it therefrom, in accordance with various other protocols, particularly digital protocols. The HART protocol or the Profibus PA protocol may be mentioned as examples in this respect.

These field devices are also supplied with power via the 4 mA to 20 mA current signal, so that no additional supply line is required besides the two-wire line. In order to keep the effort for wiring and installation and safety measures, e.g. for use in explosion-protected areas, as small as possible, it is not desired to provide additional power supply lines.

From the prior art, external operating units are known, for example, which are physically connected to the 4 mA to 20 mA current loop for communication with the field device, in order thus to enable the operation of the field device via the 4 mA to 20 mA current loop by means of the HART protocol. Such external operating units have the disadvantage that they have to be physically connected to the 4 mA to 20 mA current loop, as was already mentioned. For this purpose, the two-wire line has to be modified, e.g. stripped of insulation and/or cut through, such that the operating unit can be connected. This constitutes a relatively high degree of effort and is not always easy to carry out on-site.

Moreover, it is known from the prior art to use radio modules for an easier operation of field devices. Solutions are known in which the field devices have integrated radio modules, in which radio modules are laboriously retrofitted or are arranged in a transmitter power supply unit, a device for supplying the field devices with power. Particularly in the case of the variants with an integrated radio module or with a radio module to be retrofitted, there is the problem in the prior art that, with a power supply via the 4 mA to 20 mA current loop, only very small powers are available and the energy that can be supplied via the current loop is in part insufficient for supplying the radio module, the electronics module and the sensor with enough energy simultaneously, so that operation is not possible or only with difficulty.

For this, solutions are known in the prior art in which the radio module is provided with its separate supply line or in which additional batteries for the operation of the radio module are provided in the field device. Separate supply lines, however, cause the above-mentioned increased installation and safety effort which is to be avoided. All field devices equipped with radio modules in this case additionally involve the risk of not always being completely controllable, so that an inadvertent operation or deliberate manipulation could not be excluded or prevented at all times.

It is the object of the invention to enable a simple retrofitting of secure radio modules with an expanded range of functions and exclude attacks by targeted manipulation of field devices because they constitute an increasing risk.

Thus, the invention is based on the object of enhancing a known field device with a preferably modular structure such that the disadvantages and risks known from the prior art are avoided.

This object is accomplished by a field device having the features described herein below.

BRIEF SUMMARY OF THE INVENTION

In a preferred embodiment, an automation technology field device (1), comprising a radio module (9), wherein the radio module (9) is configured such that it forms at least one first radio channel (91) and one second radio channel (92), wherein the first radio channel (91) is configured for a reading access and the second radio channel (92) for a writing access to the field device (1), characterized in that the second radio channel (92) is deactivated in a basic state of the field device (1) and the field device (1) has a switching element at least partially realized as hardware, wherein the switching element is configured such that the second radio channel (92) can be activated.

In another preferred embodiment, the automation technology field device (1) as described herein, characterized in that the switching element is configured such that the second radio channel (92) can be deactivated.

In another preferred embodiment, the automation technology field device (1) as described herein, characterized in that the switching element is coupled to a timer such that the second radio channel (92) is automatically deactivated after a predeterminable time after an activation has elapsed.

In another preferred embodiment, the automation technology field device (1) as described herein, characterized in that the switching element has an operating member (11) formed as hardware.

In a preferred embodiment, the automation technology field device (1) as described herein, characterized in that the operating member (11) is configured and arranged such that an actuation is possible only when the radio module (9) is removed from the field device (1).

In another preferred embodiment, the automation technology field device (1) as described herein, characterized in that the radio module (9) is indirectly or directly mechanically anchored, and the operating member (11) is disposed on a side facing into a housing interior, such that the operating member (11) is accessible only after the anchoring of the radio module (9) has been disconnected and it has been removed from the housing (3) of the field device (1).

In another preferred embodiment, the automation technology field device (1) as described herein, characterized in that the radio module (9) is integrated into a display and/or operating module (7).

In another preferred embodiment, the automation technology field device (1) as described herein, characterized in that the operating member (11) is configured as a switch or button coupled to an electronic control system of the radio module (9) such that the second radio channel (92) can be activated and/or deactivated.

In another preferred embodiment, the automation technology field device (1) as described herein, characterized in that the field device (1) has an independent communication channel that enables a reading access to diagnostic data.

In another preferred embodiment, the automation technology field device (1) as described herein, characterized in that the second radio channel (92) is configured exclusively for a writing access to a parameter memory of the field device (1).

In another preferred embodiment, the automation technology field device (1) as described herein, characterized in that the field device (1) can be mechanically locked and secured against unauthorized operation.

In another preferred embodiment, a modular field device system for building field devices (1), comprising:
  a plurality of housings (3),
  a plurality of sensors (5),
  a plurality of electronics modules (6) that can be connected to the sensors (5), and
  a plurality of display and/or operating modules (7) that can be connected to the electronics modules (6), wherein the field device system has at least one display and/or operating module (7) with a radio module (9) for wireless communication with at least one further unit, wherein the radio module (9) forms at least one first radio channel (91) and one second radio channel (92), wherein the first radio channel (91) is configured for a reading access and the second radio channel (92) for a writing access to the field device (1) characterized in that the display and/or operating module (7) has a switching element at least partially realized as hardware, wherein the switching element is configured such that the writing access to the field device (1) can be activated.

DETAILED DESCRIPTION OF THE INVENTION

Figure 1:
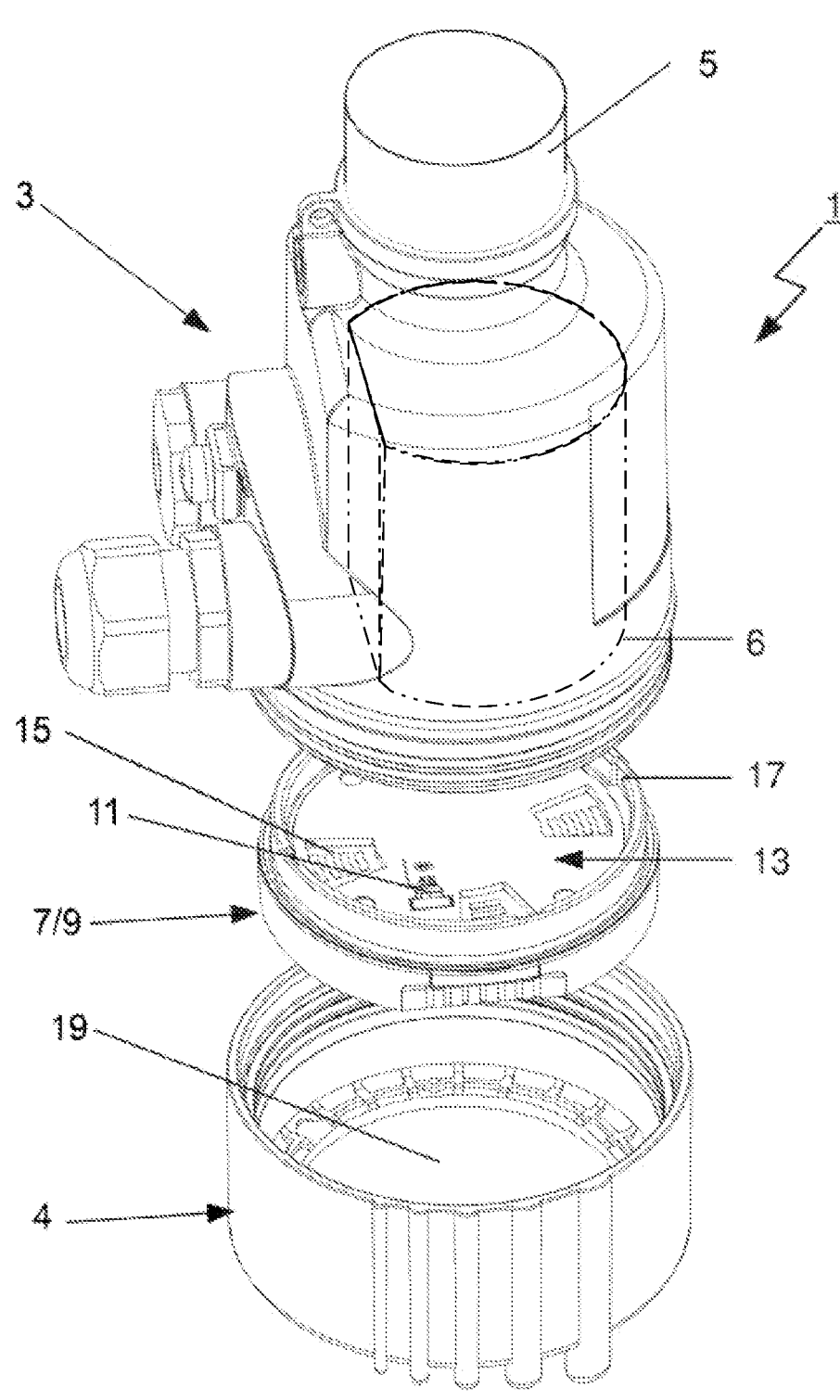
FIG. 1 illustrates an exploded view of a field device in accordance with the present invention.

An automation technology field device according to the invention comprises a radio module, wherein the radio module is configured such that it forms at least one first radio channel and one second radio channel, wherein the first radio channel is configured for a reading access and the second radio channel for a writing access to the field device. According to the invention, the second radio channel is deactivated in a basic state of the field device and the field device has a switching element at least partially realized as hardware, wherein the switching element is configured such that the second radio channel can be activated.

A field device is a technical device in the field of automation technology, which is directly connected with a production process. In automation technology, "field" refers to the area outside of control cabinets and control centers. Field devices may thus be both actuators and sensors (measuring transmitters) in factory and process automation.

A radio module according to the present application is to be understood to be a unit consisting of a radio transmitter and a radio receiver, which is configured, on the one hand, for radio communication with a higher-level unit and, on the other hand, for communication with the field device electronics of the field device. The radio transmitter and radio receiver may be configured as a single unit but also separately from one another. Moreover, several radio transmitters and/or several radio receivers for different radio standards may be incorporated.

In particular, any communication standard for near-distance communication and/or long-distance communication may be used. For example, the radio module may be a WLAN (Wireless Local Area Network), a GPRS (General Packet Radio Service), a mobile telephony, an LTE (Long Term Evolution), a 3G, a 4G, a 5G radio module. Other radio modules, such as NBIoT, Zigbee, Sigfox, LPWAN, LoRa, Bluetooth-, Bluetooth-LE modules may also be used. Several such communications modules may be provided in order to enable communication via different communication standards or a combination thereof. For example, NB-IoT or LoRa technologies may be used for radio transmission. With these technologies, it is possible to wirelessly cover large distances. However, near-distance radio modules, such as Bluetooth or NFC, for example, may be used in order to perform a convenient parameterization across short distances, e.g. by means of a portable input device.

A radio channel according to the present application is to be understood to be a separate communication path via which data and values can be transmitted. The first radio channel is configured for a writing access, i.e. data of the field device can be read via the first radio channel, particularly from a memory of the field device, whereas the second radio channel enables a writing access, i.e. the changing and/or creating of entries in a memory of the field device. The memory accessed by the first radio channel and the memory accessed on the second radio channel may be realized by different memory areas of a common physical memory. However, separate memory components may also be provided.

In particular, a radio channel is thus not to be understood to be a certain frequency or frequency range on which physical signals are transmitted.

According to the invention, the radio module has a switching element at least partially realized as hardware, which is configured such that the second radio channel can be activated. In this case, the switching element may be fully realized as hardware, but may, in particular, be configured as a combination of hardware and software. The writing access may be deactivated by a writing access to a memory or memory area assigned to the second radio channel being blocked, and/or by physically interrupting the second radio channel.

A complete realization as hardware may, for example, interrupt a line between the radio module, particularly the radio receiver of the radio module and an electronic system of the field module, or turn it impenetrable for signals.

However, a realization as a combination of hardware and software is preferred, wherein a switch or button realized as hardware can be read out by the software and the access can be activated by software accordingly. The crucial point is, however, that a purely software-based activation of the second radio channel and thus of the writing access is excluded, so that an actuation of the switch or button realized in hardware is absolutely required to take place on-site.

According to the invention, the second radio channel, and thus the writing access, can be activated by the switching element, i.e., the second radio channel is at first inactive and can be transferred into an active state by the switching element. A writing access by persons that do not have direct physical access to the field device is thus prevented. Only those who have physical access to the field device and can activate the second radio channel by actuating the switching element can obtain a writing access to the field device.

Due to the wireless communication via the first and second radio channels, there is a possibility of transmitting measurement values from the field device to a higher-level unit, e.g. a cloud system, such as the VEGA Inventory System offered by the applicant. In addition, it is also possible to transmit values from the higher-level unit to the field device or the radio module or a sensor incorporated into the field device. Such values may be parameters but also software update packages for the field device or sensor. Of course, it is equally possible to not only transmit parameters to the field device and there write them into a memory, but also to read them. With this functional capability, it is possible to adjust the sensor fully remotely, and also to provide it with software updates.

By means of the present invention, it is possible to prevent an unauthorized writing access to the sensor from taking place, and an unauthorized change of parameters or even an installation of malware from being carried out. Otherwise, however, a reading access still remains possible. In particular, it is desired that in a basic state of the field device, only a writing access is deactivated and can be activated. A reading access is supposed to be permanently possible.

In a further development of the field device, the switching element is configured such that the second radio channel can be deactivated. Thus, by actuating the switching element, the second radio channel and thus the writing access to the field device can both be activated and deactivated.

In addition to or as an alternative for manual deactivation of the second radio channel, the switching element may be coupled to a timer such that the second radio channel is automatically deactivated after a predeterminable time after an activation has elapsed. It can thus be effectively ensured that the field device, after an activation of the second radio channel, e.g. for a parameterization of the field device for which a writing access is necessary, automatically returns to a state in which the second radio channel is deactivated, so that no writing access to the field device is possible. Thus, a change of parameters by unauthorized persons can be effectively prevented.

In addition, the switching element can be configured and arranged such that an actuation is possible only when the radio module is removed from the field device. By means of a corresponding design, it becomes necessary to separate the radio module from the field device in order to actuate the switching element. Such a separation is registered by the field device and also by a higher-level unit, so that an activation of the second radio channel can thus be recognized in any case. Moreover, a corresponding mechanical arrangement ensures that an inadvertent activation or deactivation of the writing access is excluded.

In one embodiment, the radio module is mechanically anchored and the switching element is disposed on an underside of the radio module in such a way that the switching element is accessible only after the anchoring of the radio module has been disconnected and it has been removed from a housing of the field device. If, for example, the radio module is mechanically attached to the electronics module by means of a snap-in or bayonet lock, an operating member arranged on the underside of the radio module, i.e. on a side of the radio module facing towards the electronics module, can only be operated if the mechanical anchoring of the radio module is disconnected and the latter is removed from the electronics module.

In a further development, the radio module may be integrated into a display and/or operating module. Field devices often have a removable and replaceable display and/or operating module which can be used, for example, for displaying measurement values and parameters on-site and/or for the input into and parameterization of the field device. Such a display and/or operating module may be supplemented with a radio module, so that the radio module is integrated in the display and/or operating module. A space-saving structure and an electrically advantageous structure can be obtained by integrating the radio module into such a display and/or operating module, because the display and/or operating module generally already has corresponding electronic components for displaying measurement values and/or the configuration of the field device. In such a configuration, it is possible that the radio module only transmits the already processed measurement values or corresponding configuration features, so that an installation of multiple corresponding electronic components is not required. In this case, the part of the switching element realized as hardware may be arranged on the display and/or operating module so as to be accessible from the outside, but preferably such that in that case the display and/or operating module is mechanically arranged and anchored on the field device such that the switching element is accessible only after the anchoring has been disconnected and the display and/or operating module has been removed from a housing of the field device.

For example, the part of the switching element realized as hardware may be a switch or button coupled to an electronic control system of the radio module such that the second radio channel can be activated and/or deactivated.

If the second radio channel is configured exclusively for a writing access to a parameter memory of the field device, then precisely and exclusively this access can be prevented without any further limitations, and thus an increased security of the field device can be accomplished.

The field device further has an independent communication channel that enables a reading access at least to diagnostic data of the field device. The independent communication channel may be configured to be wireless or cable-based. For example, the independent communication channel may be the first radio channel, or a cable-based communication channel that enables a writing access to the diagnostic data. This approach is of interest particularly in the case of existing installations, because intelligent devices are frequently already installed in the field but diagnostic data remain unused.

Access to the diagnostic data enables a more comprehensive analysis of the field device function and the measurement values. For example, measurement values can be subsequently compensated based on the diagnostic data, or an anticipatory maintenance of the field device may be arranged even before an error status occurs. In case of an error status, detailed diagnostic information may help identifying the exact cause so that it can be eliminated as quickly as possible.

The independent communication channel may also be realized by cables. For example, the reading communication may take place via an Ethernet module and/or a LAN module (Local Area Network) or the like. Communication may also take place via a fieldbus, such as a HART bus, a Profibus, a Foundation Fieldbus bus, a Modbus, an SDI-12 bus, an Ethernet/IP bus, a Profinet bus, an IP-based bus, an Ethernet-IP bus, APL, a serial bus and/or a parallel bus. Other communication links, e.g. via an IO link, a 4-20 mA/Hart interface and/or a USB connection are also conceivable.

In order to increase security against unauthorized access even further, the field device may be configured to be capable of being mechanically locked and secured against unauthorized operation. For example, the field device may have a locking device in the form of a lock.

A modular field device system for building field devices is also in accordance with the invention, wherein the modular field device system comprises a plurality of housings, a plurality of sensors, a plurality of electronics modules that can be connected to the sensors, and a plurality of display and/or operating units that can be connected to the electronics modules, and wherein the field device system has at least one display and/or operating module with a radio module for wireless communication with at least one further unit, wherein the radio module forms at least one first radio channel and one second radio channel, wherein the first radio channel is configured for a reading access and the second radio channel for a writing access to the field device. According to the invention, the modular field device system is characterized in that at least one display and/or operating unit has a radio module and at least one switching element at least partially realized as hardware, wherein the switching element is configured such that the writing access to the field device can be activated.

In a modular field device design, one module may be respectively selected from amongst a plurality of combinable sensors, housings, electronics modules and operating and/or display modules, and a corresponding field device may be composed therefrom. Such a modular field device design is being offered by Vega Grieshaber KG, for example. Generally, one sensor for converting the quantity to be measured into an electrical signal, one corresponding electronics module, which provides for measurement value processing as well as various interfaces to a control unit, for example, and optionally different communication media and which contains a power supply, and various display and/or operating modules can be combined in each case. The sensors, electronics modules and display and/or operating modules are adapted to one another as well as to various available housings.

In this case, the electronics module includes various components that are integrated into a single unit and preferably form an independently usable unit. In particular, the electronics module may include interfaces with one or more transducers (sensors) and/or display and/or operating modules, with the interfaces having a wired and/or wireless configuration. Moreover, the electronics module may include, in particular, circuit components for measurement value processing, i.e. in particular computing units, such as Application Specific Integrated Circuits (ASIC), controllers or processors, filters or the like, as well as, optionally, one or more memory units. Furthermore, the electronics module may include one or more communication interfaces, particularly for communication with a higher-level unit, a display and/or operating module and/or the sensor. The communication interfaces may be configured as digital or analog interfaces and support direct point-to-point communication and/or bus communication and/or a packet-switched, e.g. Ethernet, communication. The communication interfaces may have a bidirectional or unidirectional configuration. Moreover, the communication interfaces may have a cable-based or wireless configuration and, accordingly, support cable-based and/or wireless, i.e. radio, communication and communication protocols. Moreover, the electronics module may also provide a power supply for the field device, e.g. in the form of a power supply interface, preferably in the form of a power input and/or a power storage unit.

In one variant, the electronics module preferably includes a combined power and data interface in which power and data are transmitted simultaneously. Two-wire interfaces are preferred because they can be made intrinsically safe. A combined power and data interface may be configured, for example, in accordance with the 4-20 mA standard, with an analog or digital data transmission, e.g. in accordance with the HART protocol. In addition or as an alternative, the electronics module may also have a two-wire Ethernet interface, which is preferably capable of implementing communication in accordance with the Ethernet APL standard.

Here, it may be remarked at this point that all of the above-mentioned interfaces may form both a mechanical interface and/or an electrical interface and/or a data interface.

The field device is preferably configured as a modular field device, wherein it includes at least one measuring transmitter, an electronics module adapted to the measuring transmitter as well as a display and/or operating module, which is adapted thereto, with a radio module, which forms at least one first radio channel and one second radio channel, wherein the first radio channel is configured for a reading access and the second radio channel for a writing access to the field device, wherein the field device, and in particular the radio module, are configured in accordance with the preceding description.

DETAILED DESCRIPTION OF THE FIGURES

FIG. 1 shows an exploded view of a perspective view of a field device 1 in accordance with the present application.

Essentially, the field device 1 includes a housing 3 in which an electronics module 6 is disposed (which in the present case is indicated by a dashed line within the housing). A sensor 5, which in the present case is shown only schematically and which is arranged on the housing 3, is connected to one end of the electronics module 6. However, the sensor 5 may also be separated from the housing 3 by corresponding measurement lines and be arranged in a measurement environment using corresponding extensions.

The field device 1 can be connected to a higher-level unit, e.g. a control room, control center or control station, via a two-wire line routed through a corresponding opening of the housing 3, and at the same time be supplied with power through this line.

In this case, the electronics module 6 includes various components, which are accommodated in a common inner housing, the so-called electronics cup, and integrated into a single unit. Thus, the electronics module 6 can be handled as a single component. The electronics module 6 has an interface with the sensor 5 and a further interface with a display and operating module 7, wherein the interfaces are in the present exemplary embodiment configured in a cable-based manner. The electronics module 6 further has circuit components for measurement value processing, i.e. in particular computing units, in the present case a controller, and a memory for storing therein measurement data, diagnostic data, operating parameters and operating programs of the field device 1. Several controllers and/or memories are also possible in alternative embodiments.

Furthermore, the electronics module 6 includes several communication interfaces for communication with a control center. In the present case, the communication interface is configured as a combined power and data interface in which power and data are transmitted simultaneously. In the present exemplary embodiment, the communication interface is configured as an Ethernet-APL interface. However, other cable-based or also wireless communication interfaces with and without an integrated power supply for the field device 1 are conceivable.

A display and/or operating module 7 with an integrated radio module 9 is arranged in the present exemplary embodiment at a side of the electronics module 6 opposite the sensor side. The display and/or operating module 7 can be mechanically connected with the electronics module 6 via a bayonet lock 17 provided on a peripherally extending edge of the display and/or operating module 7, wherein, in the case of a mechanical connection, an electrical connection is established at the same time by means of terminal contacts 15 disposed on the underside of the display and/or operating module 7. In the present exemplary embodiment, a display for displaying measurement values or other device-specific information and a keypad for inputting operation information, e.g. for the configuration of the electronics module 6, is arranged on a side of the display and/or operating module 7 facing away from the electronics module 6. In the present exemplary embodiment, the housing 3 can be sealed with a lid 4, wherein a viewing window 19 is disposed in the lid 4, so that the display of the display and/or operating module 7 remains visible from the outside even if the lid 4 is installed.

By means of the second electrical interface, measurement values are transmitted to the higher-level unit, and a separate communication channel for an exclusively reading access to a memory area of the field device 1 can be established, wherein diagnostic data and parameters of the field device 1, for example, are stored in the memory area. For example, the diagnostic data can be read out via the separate communication channel, for example, and an anticipatory device maintenance can thus be carried out.

The crucial point here is that the reading access takes place in a non-reactive manner, i.e., that the additional communication channel has no retroactive effects on a parameterization or a software (firmware) installed on the field device 1. This is accomplished by a writing access to the memory taking place via a separate communication channel, which is configured as a second radio channel of the radio module 9 and which is deactivated in a basic state of the field device 1.

In the present exemplary embodiment, an operating member 11 for activating and deactivating the second radio channel of the radio module 9 arranged in the display and/or operating module 7 is arranged on the side of the display and/or operating module 7 facing towards the electronics module 6. In the present exemplary embodiment, the operating member 11 is configured as a mechanical slide switch, but may also be configured as a toggle switch, button, magnetic switch or the like. The operating member 11 cooperates with a control software of the field device 1 in such a manner that a switching element is formed, which enables the second radio channel and thus the writing access to the memory only in one switching position of the slide switch, and otherwise disables them.

In one variant, the operating member 11 is configured as a button. The button is linked to the control software such that the second radio channel is activated upon actuation of the button and then automatically blocks again after a predetermined period has elapsed, in the present case 15 minutes. A re-enablement can only take place by actuating the button again.

Alternatively, it may also be possible to extend the enablement by a reset of the timer in the control software, wherein an initial enablement is effected exclusively by means of the operating member 11. In order to prevent a future extension of the access in this manner, a number of extensions can be limited by means of the control software, e.g. to three extensions per session initialized (started) by means of the operating member 11.

In the present exemplary embodiment, the operating member 11 is accessible for activating and deactivating the radio module 9 only if the display and/or operating module 7 is separated from the electronics module 6 and removed from the housing 3. Thus, effective protection against operating errors is provided.

Moreover, due to the fact that the display and/or operating module 7 has to be removed from the electronics module 6 in order to actuate the operating member 11, a signal is sent to the higher-level unit, so that a manipulation can be reliably recognized.

Alternatively, however, the operating member 11, i.e. the part of the switching element realized as hardware, which in the present case is realized as a slide switch, may also be configured as a toggle switch, button or magnetic switch or the like.

Figure 2:
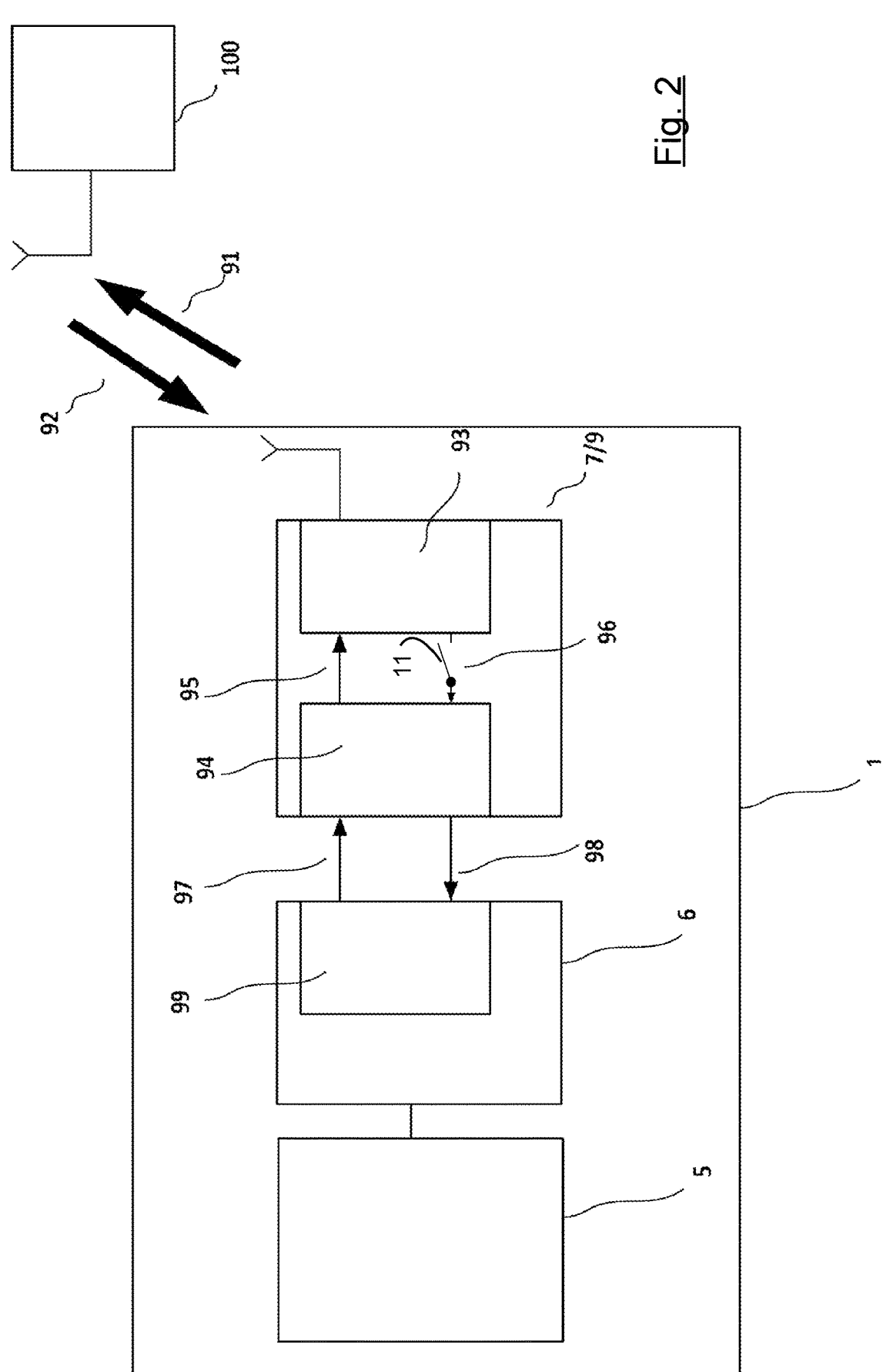
FIG. 2 illustrates a block circuit diagram of the field device according to FIG. 1.

FIG. 2 shows a block circuit diagram of the field device 1 from FIG. 1 with a radio module 9 configured in accordance with the present application.

The block circuit diagram essentially shows the electronics module 6, the display and/or operating module 7 with the radio module 9, and a higher-level unit with a radio interface 100.

The electronics module 6 has a communication unit 99, which communicates with a second communication unit 94 in the display and/or operating module 7 via a transmitting channel 97 and a receiving channel 98. In turn, the communication unit 94 is connected to a transmitting and/or receiving unit 93 of the radio module 9 via a transmitting channel 95 and a receiving channel 96. The transmitting and/or receiving unit 93 can send data via the first radio channel 91 to the higher-level unit 100 and receive data via the second radio channel 92. Data can be sent and received from the electronics module 6 to the higher-level unit 100 via these communication paths.

Data sent via the communication paths 97, 95 and 91 may be measurement values/diagnostic values, for example. Data received via the communication paths 92, 96 and 98 may be parameter values, for instance, which are sent by the higher-level unit 100 to the electronics module 6 and are there written into a memory area. The communication paths 97, 98 and 95, 96 may be RXD and TxD lines of a serial communication interface, for example.

One configuration, for example, is the realization of the operating member 11 as a hardware switch in the receiving line 96; if the switch is open, no data are forwarded any longer to the communication unit 94 and thus to the electronics module 6.

In another possible embodiment, the switch is connected to the radio module 93 and is evaluated by the radio module, so that if the switch is open, for example, no data are accepted via the radio channel 92.

LIST OF REFERENCE NUMBERS

1 Field device
3 Housing
4 Lid
5 Sensor
6 electronics module
7 Display and/or operating module
9 Radio module
11 Operating member
15 Terminal contact
17 Bayonet lock
19 Viewing window
91 First radio channel
92 Second radio channel Unless indicated otherwise, identical reference numbers in the figures identify identical components with the same function. The terms drive unit and drive are used interchangeably herein.

The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable equivalents.

We claim:

1. An automation technology field device, comprising a radio module, wherein the radio module is configured such that it forms at least one first radio channel and one second radio channel, wherein the first radio channel is configured for a reading access and the second radio channel for a writing access to the field device, wherein the second radio channel is deactivated in a basic state of the field device and the field device has a switching element at least partially realized as hardware, wherein the switching element is configured such that the second radio channel can be activated only by a person with physical access to the field device actuating the switching element.

2. The automation technology field device according to claim 1, wherein the switching element is configured such that the second radio channel can be deactivated.

3. The automation technology field device according to claim 1, wherein the switching element is coupled to a timer such that the second radio channel is automatically deactivated after a predeterminable time after an activation has elapsed.

4. The automation technology field device according to claim 1, wherein the switching element has an operating member formed as hardware.

5. The automation technology field device according to claim 1, wherein the operating member is configured and arranged such that an actuation is possible only when the radio module is removed from the field device.

6. The automation technology field device according to claim 1, wherein the radio module is indirectly or directly mechanically anchored, and the operating member is disposed on a side facing into a housing interior, such that the operating member is accessible only after the anchoring of the radio module has been disconnected and it has been removed from the housing of the field device.

7. The automation technology field device according to claim 1, wherein the radio module is integrated into a display and/or operating module.

8. The automation technology field device according to claim 1, wherein the operating member is configured as a switch or button coupled to an electronic control system of the radio module such that the second radio channel can be activated and/or deactivated.

9. The automation technology field device according to claim 1, wherein the field device has an independent communication channel that enables a reading access to diagnostic data.

10. The automation technology field device according to claim 1, wherein the second radio channel is configured exclusively for a writing access to a parameter memory of the field device.

11. The automation technology field device according to claim 1, wherein the field device can be mechanically locked and secured against unauthorized operation.

12. A modular field device system for building field devices, comprising
   a plurality of housings,
   a plurality of sensors,
   a plurality of electronics modules that can be connected to the sensors, and
   a plurality of display and/or operating modules that can be connected to the electronics modules, wherein the field device system has at least one display and/or operating module with a radio module for wireless communication with at least one further unit, wherein the radio module forms at least one first radio channel and one second radio channel, wherein the first radio channel is configured for a reading access and the second radio channel for a writing access to the field device wherein the display and/or operating module has a switching element at least partially realized as hardware, wherein the switching element is configured such that the writing access to the field device can be activated only by a person with physical access to the field device actuating the switching element.

* * * * *